United States Patent

Chang

[11] 4,041,515
[45] Aug. 9, 1977

[54] AVALANCHE TRANSISTOR OPERATING ABOVE BREAKDOWN

[75] Inventor: Kern Ko Nan Chang, Princeton, N.J.

[73] Assignee: RCA Corporation, New York, N.Y.

[21] Appl. No.: 632,062

[22] Filed: Nov. 14, 1975

[51] Int. Cl.² .......................................... H01L 29/90
[52] U.S. Cl. ........................................ 357/13; 357/57; 357/58; 331/107 R
[58] Field of Search ......................... 357/13, 57, 58; 331/107 R

[56] References Cited

U.S. PATENT DOCUMENTS

| | | | |
|---|---|---|---|
| 3,469,117 | 9/1969 | Mizushima et al. | 357/13 |
| 3,544,855 | 12/1970 | Nannichi | 357/13 |
| 3,566,206 | 2/1971 | Bartelink et al. | 357/13 |
| 3,855,605 | 12/1974 | Kawamoto | 357/13 |

Primary Examiner—Stanley D. Miller, Jr.
Assistant Examiner—Joseph E. Clawson, Jr.
Attorney, Agent, or Firm—H. Christoffersen; Joseph D. Lazar; Robert M. Rodrick

[57] ABSTRACT

An avalanche transistor (three terminal avalanche device) is provided with a p+ electrode, for example, added to an n+ - n - n+ structure. A reverse bias junction is provided by a first voltage source connected between the p+ electrode and one of the n+ electrodes. The magnitude of the reverse bias is such as to cause impact ionization. Forward bias voltage is provided by a second source connected between the other n+ electrode and the p+ electrode. Input or control signals are applied in series with the second source to add or subtract from the voltage level of the second source, controlling the number of minority carriers injected into the n+ - n - n+ structure to cause a change in breakdown voltage and operating point of the device.

3 Claims, 2 Drawing Figures

AVALANCHE TRANSISTOR OPERATING ABOVE BREAKDOWN

BACKGROUND OF THE INVENTION

1. Field of the Invention

This invention relates to avalanche devices and particularly to three terminal avalanche devices or avalanche transistors.

2. Description of the Prior Art

Transistors are well known in the state of the art. The current amplification factor ($\alpha$) in conventional transistors is of the order of unity. Avalanche transistors are also well known. Prior art avalanche transistors operate with collector voltages below breakdown but in the range where avalanche multiplication of the collector current occurs. In this case $\alpha$ is slightly greater than one. See, for example, pages 238 thru 241 of "The Properties, Physics and Design of Semiconductor Devices" by John N. Shive published in 1959 by D. Van Nostran Company, Princeton, N.J. These devices operate at relatively low power levels (on the order of milliwatts). It is desirable to provide avalanche amplifiers or control devices that operate at relatively high power levels (of the order of several watts or higher).

SUMMARY OF THE INVENTION

An avalanche transistor includes a body of semiconductor material having a substrate of a first conductivity type material with two separated regions of highly doped material of the same conductivity type and a region of highly doped material of a second opposite conductivity type. A reverse biasing voltage at a level above breakdown is provided by a source connected between one of the highly doped regions of the first conductivity type and the region of the second conductivity type. A controllable forward biasing voltage is provided between the other region of highly doped material of the first conductivity type and the region of second conductivity type material for controlling the number of minority carriers injected into the structure of the first conductivity type material.

BRIEF DESCRIPTION OF THE DRAWING

A more detailed description follows in conjunction with the following drawing, wherein.

DETAILED DESRIPTION OF THE PREFERRED EMBODIMENT

Figure 1:
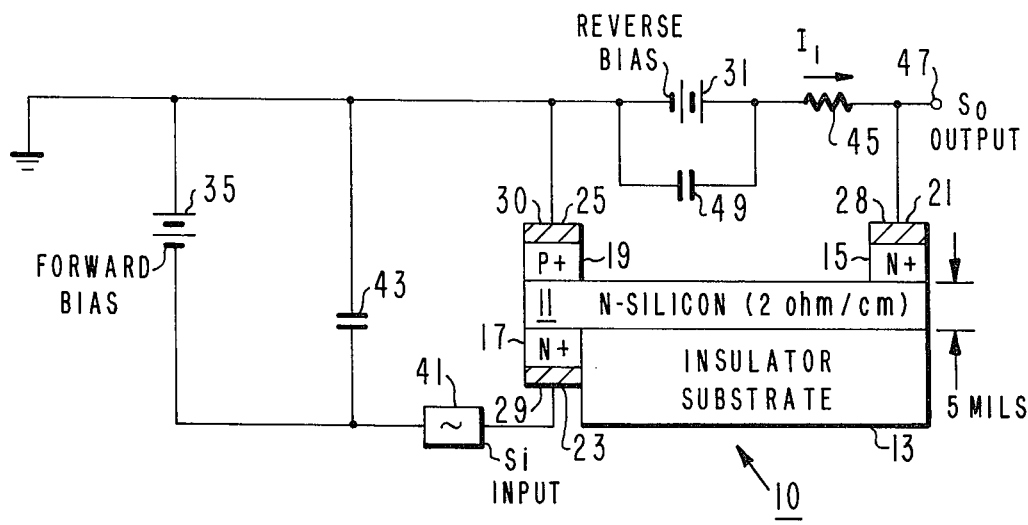
FIG. 1 is a cross-sectional view of one embodiment of the present invention.

Referring to FIG. 1, the construction of a three terminal avalanche device or avalanche transistor 10 is shown. The transistor 10 comprises a body of semiconductor material such as silicon. In the preferred embodiment shown, the body comprises an n-type substrate 11 on an insulator substrate 13. The insulator structure 13 may be, for example, sapphire. On the n-type substrate 11 are highly doped n+ type regions 15 and 17 and p+ type region 19. The n+ type regions 15 and 17 are for example epitaxially grown upon the n-type layer 11. A p+ region 19 is epitaxially grown on the n-type layer 11 near the end of the substrate 11 at which n+ region 17 is grown.

Certain impurity materials in some semiconductors have the characteristic of causing the semiconductor material to be heavily p-type (or n-type) while also being of high resistivity. The reason for this is that the acceptor (or donor) levels are relatively deep, meaning that they are relatively far from the energy level of the valence (or conduction) band. By "relatively far" is meant more than about 0.1 electron volt. Example of such impurities are iron doped gallium-arsenide which is p-type and has an acceptor level that is 0.3 electron volt deep or chromium doped gallium-arsenide which is also p-type and has an acceptor level that is 0.7 electron volt deep. Examples for n-type impurities are silver or mercury doped silicon, which have donor levels which are each 0.3 electron volt deep.

Ohmic contacts 21, 23 and 25 further comprise metal contact electrodes 28, 29 and 30 on the n+ region 15, n+ region 17 and p+ region 19, respectively. A reverse bias voltage provided by a source 31 is coupled between the electrodes 28 and 30. The negative terminal of source 31 is connected to electrode 30 and the positive terminal of source 31 is connected to electrode 28. The voltage level at source 31 is such as to bias p+ - n - n+ region into the impact avalanche region wherein the device operates above avalanche breakdown where the $\alpha$ or current amplification factor is many times (for example, one thousand) that of unity. A forward bias voltage 35 is coupled between the electrodes 29 and 30.

Figure 2:
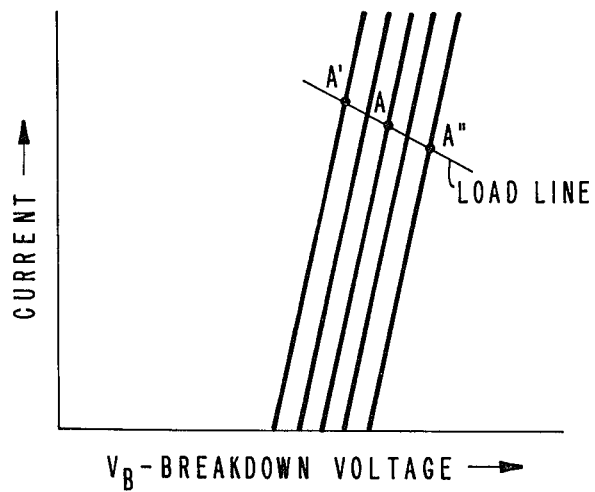
FIG. 2 is a graph of output current vs. reverse biasing voltage for the embodiment of FIG. 1.

It has been found that the voltage level applied across the terminals 29 and 30 control the number of minority carriers injected into the n-layer 11. Further, the breakdown voltage-doping product is a constant $$V_B \times N_d = E_c/2^2/2 \, (\epsilon/q),$$

where $V_B$ is breakdown voltage, $N_d$ is the doping density, $E_c$ is the critical field, $\epsilon$ is the dielectric constant of the material, and $q$ is the charge. By minority carrier injection, the doping intensity $N_d$ is increased. Therefore, by controlling the forward bias voltage the breakdown voltage vs. current characteristic curve is changed as illustrated in FIG. 2. Therefore, an input control signal can be applied from a signal source 41 in series with the battery source 35. Decoupling of the battery may be provided by capacitor 43 as shown in FIG. 1. The output signals may be taken across a resistor 45 in series with the source 31. The output signal may be taken at terminal 47. Decoupling of the input signal from source 31 is provided by bypass capacitor 49 coupled across the source 31. The electrode 30 may be coupled to ground or point of reference potential. Changes in the input signal Si cause the operating point in FIG. 2 to change from point A to A', for example, as the input signal rises in value and from point A' to A'', for example, as the input signal Si is below the original value. In an experimental model, the substrate 11 as described above was 40 mils long and 30 mils wide. The substrate 11 was 5 mils thick and the reverse bias voltage was about 110 volts and forward bias about 1 to 1.5 volts. To achieve a high power switching device, it is important that the resistivity of the material be on the order of 2 ohms per centimeter and that the material be pure, homogeneous, and free of discloration. These requirements are necessary to prevent hot spots which can cause complete burnout of portions of the material.

What is claimed is:

1. An avalanche device comprising,
    a body of semiconductor material having a substrate of one conductivity type material with two separate regions of highly doped material of said one conductivity type on said substrate and a region of highly doped material of a second different conductivity type on said substrate, means for applying a reverse bias voltage between said region of material of said second conductivity type and one of said regions of highly doped material of said one conductivity type, said reverse bias voltage having a magnitude to exceed the avalanche breakdown of voltage of said substrate where current amplification factor is many times that of unity and, means for applying a controllable forward bias voltage between said region and of material of said second conductivity type and the other of said regions of said one conductivity type for controlling the number of minority carriers injected into the substrate to thereby change the breakdwon voltage and operating point of said device.

2. The combination claimed in claim 1 wherein said conductivity type is N-type material, and said second conductivity type material is P.

3. The combination claimed in claim 1 wherein said means for applying a controllable forward bias voltage includes a source of D.C. potential, and means for applying control signals in series with said source.

* * * * *

UNITED STATES PATENT OFFICE
CERTIFICATE OF CORRECTION

PATENT NO. : 4,041,515

DATED : August 9, 1977

INVENTOR(S) : Kern Ko Nan Chang

It is certified that error appears in the above-identified patent and that said Letters Patent are hereby corrected as shown below:

Column 2, line 61, "discloration" should be --dislocation--;
Column 3, claim 1, line 13, after "region" delete --and--;
Column 4, claim 2, line 6, after "said" insert --one--.

Signed and Sealed this

Thirteenth Day of December 1977

[SEAL]

Attest:

RUTH C. MASON
Attesting Officer

LUTRELLE F. PARKER
Acting Commissioner of Patents and Trademarks